United States Patent
Lin et al.

[11] Patent Number: 6,119,925
[45] Date of Patent: Sep. 19, 2000

[54] METHOD FOR SOLDERING AN ELECTRICAL ELEMENT TO A MOTHERBOARD

[75] Inventors: Nick Lin, Hsin-Chuang; Jeng-Shiun Liu, Jeng-Shiun, both of Taiwan

[73] Assignee: Hon Hai Precision Ind. Co., Ltd., Taipie Hsien, Taiwan

[21] Appl. No.: 09/302,667

[22] Filed: Apr. 30, 1999

[30] Foreign Application Priority Data

Dec. 18, 1998 [TW] Taiwan .................. 87121202

[51] Int. Cl.[7] .............. B23K 31/00; H05K 3/34
[52] U.S. Cl. .......... 228/180.22; 29/840; 361/768
[58] Field of Search ............ 228/180.22, 35, 228/41, 258; 361/768; 29/839, 840

[56] References Cited

U.S. PATENT DOCUMENTS

| | | | |
|---|---|---|---|
| 4,752,027 | 6/1988 | Gschwend | 228/180.2 |
| 4,970,573 | 11/1990 | Roberts et al. | 357/71 |
| 5,094,900 | 3/1992 | Langley | 428/131 |
| 5,198,695 | 3/1993 | Hanes et al. | 257/773 |
| 5,435,482 | 7/1995 | Variot et al. | 228/254 |
| 5,519,936 | 5/1996 | Andros et al. | 29/840 |
| 5,788,143 | 8/1998 | Boyd et al. | 228/253 |
| 5,796,589 | 8/1998 | Barrow | 361/774 |
| 5,816,482 | 10/1998 | Grabbe | 228/212 |
| 5,859,474 | 1/1999 | Dordi | 257/737 |
| 5,901,437 | 5/1999 | Variot et al. | 29/840 |
| 5,969,424 | 10/1999 | Matsuki et al. | 257/768 |
| 6,016,254 | 1/2000 | Pfaff | 361/769 |

*Primary Examiner*—Patrick Ryan
*Assistant Examiner*—L. Edmondson
*Attorney, Agent, or Firm*—Wei Te Chung

[57] ABSTRACT

A method for soldering an electrical element to a mother board includes the following steps. Firstly, the electrical element is prepared for soldering and deposited on an appropriate machine. Secondly, solder balls are deposited at openings of terminal receiving passageways of the electrical element by means of appropriate tools. Thirdly, the solder balls are heated to a semi-meltdown status and top surfaces of the solder balls are leveled by means of leveling tools. Lastly, the solder balls are mounted onto corresponding electrical contact pads of the mother board and reheated to melting temperature thereby completing the soldering process.

8 Claims, 4 Drawing Sheets

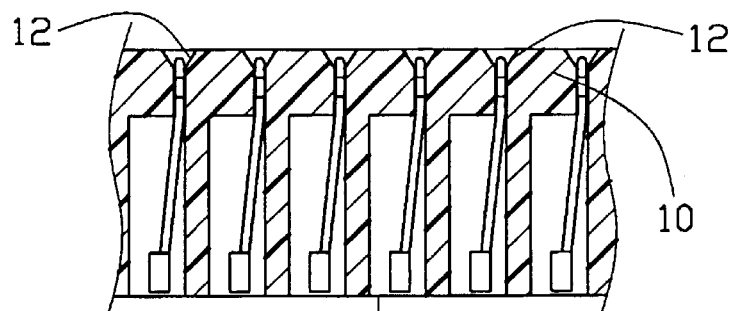
FIG. 3A
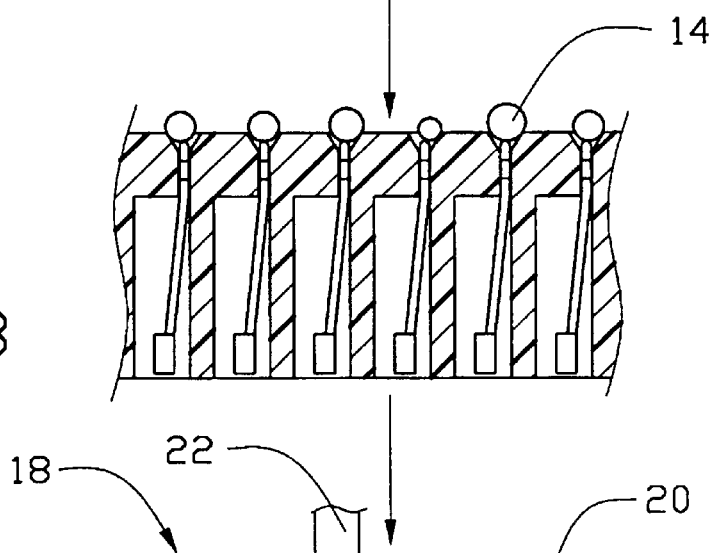
FIG. 3B
FIG. 3C
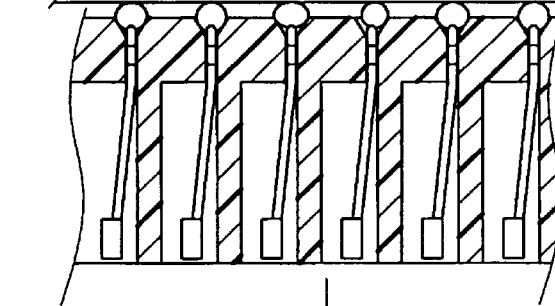
FIG. 3D
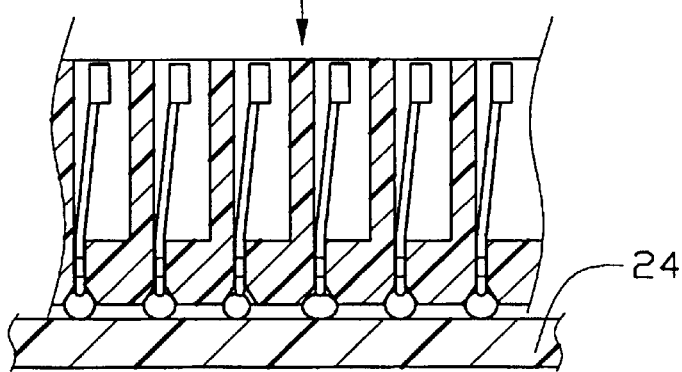

METHOD FOR SOLDERING AN ELECTRICAL ELEMENT TO A MOTHERBOARD

BACKGROUND OF THE INVENTION

The present invention relates to a method for electrically connecting an electrical element to a motherboard in a reliable manner.

Soldering connections have been adopted for mounting electrical elements to a motherboard by through hole technology (THT) and surface mount technology (SMT). In THT, through holes are required thereby interfering with the circuit layout of the motherboard. Through holes are unnecessary in SMT thereby favoring the circuit layout of the motherboard which has multiple layers of circuits therein, as well as conserving the occupied space thereon.

As shown in FIGS. 1A–1C, using conventional soldering techniques for electrically connecting an electrical element 101 to a mother board 241, the electrical element 101 is soldered by means of SMT onto the mother board 241 after solder balls 141 are deposited on a surface of the electrical element 101 (FIG. 1B). However, since the size of the solder balls 141 is not uniform, the top surfaces thereof are not exactly aligned in the same plane which will adversely affect the soldering process. A product resulting from such a soldering process may require reworking of open circuits existing in the electrical element 101 thereby increasing costs. Furthermore, such a resulting product may have a short life-span and a low resistance against negative environmental affects.

SUMMARY OF THE INVENTION

The primary purpose of the present invention is to provide a method for electrically connecting an electrical element such as an electrical connector or chip package, to a mother board in a reliable manner.

To achieve the above purpose, solder balls are deposited at openings of terminal receiving passageways of an electrical element. The solder balls extend beyond a surface of the electrical element and undergo a leveling procedure whereby top surfaces thereof are deformed to lie in a common plane thereby increasing reliability when soldering the element to the mother board. During the leveling procedure, the solder balls are heated to semi-meltdown status for facilitating the deformation thereof. The provision of the leveling ensures proper soldering of the electrical element to the motherboard and enhances the quality of the resulting products.

In accordance with another aspect of the present invention, arcuated chamfers are disposed on a surface of the electrical element communicating with the passageways thereof for providing the solder balls with means for stable depositing thereby facilitating soldering to the motherboard. Furthermore, feet of conductive terminals extend into the arcuated chamfers but not beyond the surface of the electrical element.

The method for electrically connecting an electrical element to a mother board in a reliable manner is described as followings. Firstly, the electrical element is prepared to be arranged on a positioning machine. Secondly, solder balls are deposited at openings of terminal receiving passageways of the electrical element by means of appropriate tools. Thirdly, top surfaces of the solder balls are leveled to lie in a common plane by means of leveling tools when the solder balls are heated to a semi-meltdown status. Lastly, the solder balls are mounted onto corresponding electrical contact pads of the mother board, and are then reheated to melting temperature thereby completing the soldering process.

Furthermore, a pressing action takes place after the solder balls being deposited at opening of terminal receiving passageways of the electrical element. The pressing action gently presses the solder balls so as to ensure the coplanarity of the top surfaces thereof.

Other objects, advantages and novel features of the invention will become more apparent from the following detailed description when taken in conjunction with the accompanying drawings.

BRIEF DESCRIPTION OF THE SEVERAL VIEWS OF THE DRAWINGS

FIG. 3A–FIG. 3D are sequential, cross-sectional views of the soldering method in accordance with the present invention for electrically connecting an electrical element to a motherboard.

DETAILED DESCRIPTION OF THE PREFERRED EMBODIMENTS

Figure 1A:
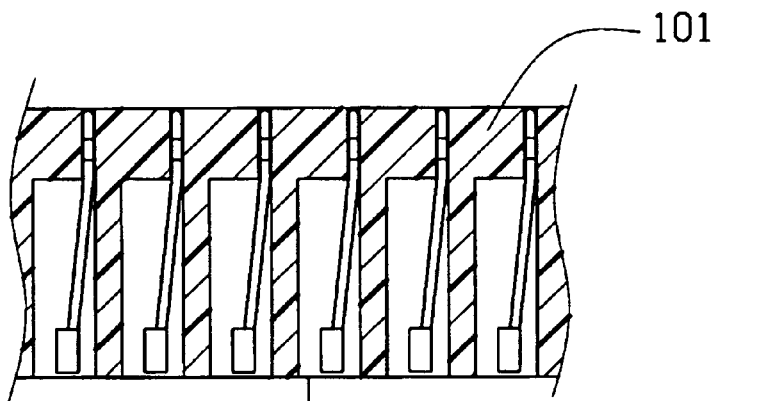
FIG. 1A–FIG. 1C are sequential, cross-sectional views showing a conventional method for electrically connecting an electrical element to a motherboard.
Figure 1B:
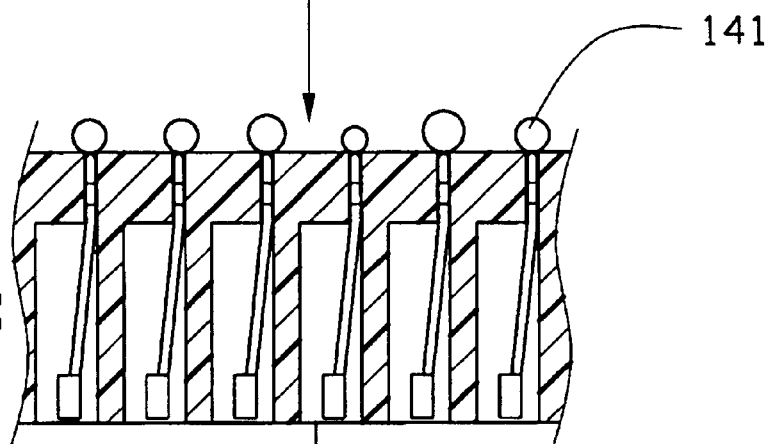
Figure 1C:
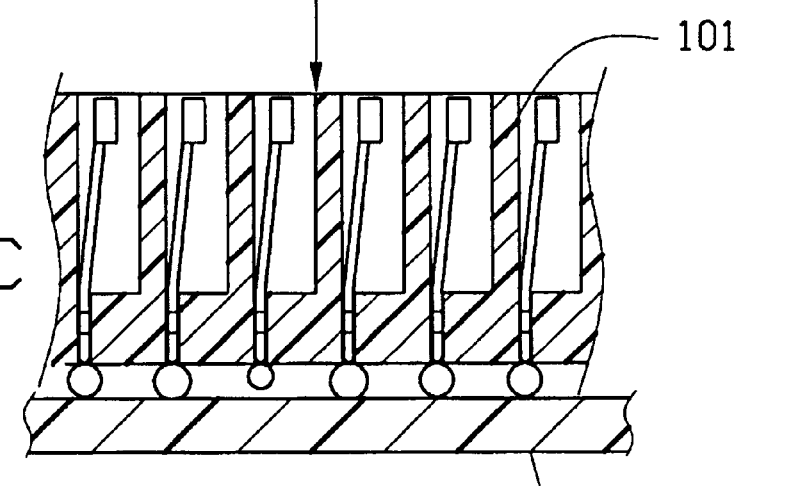
Figure 2:
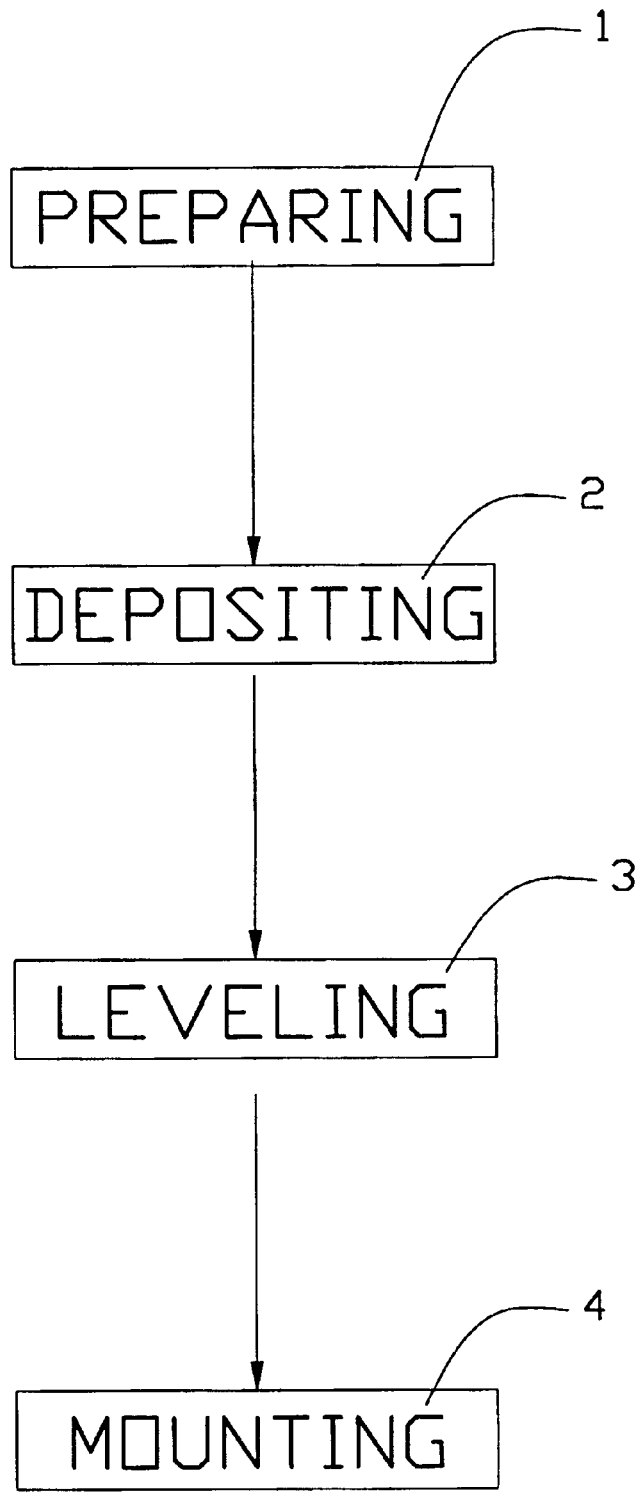
FIG. 2 is a flow chart of a method in accordance with the present invention for electrically connecting an electrical element to a motherboard.

Referring to FIG. 2 and FIGS. 3A–3D, a method in accordance with the present invention for electrically connecting an electrical element 10 to a mother board 24 in a reliable manner comprises: a predetermined preparation step, a depositing solder balls 14 step, a leveling step and a soldering step. The predetermined preparation step prepares the electrical element 10 to be soldered on a positioning machine. The depositing solder balls 14 step deposits the solder balls 14 at openings 12 of terminal receiving passageways (not labeled) of the electrical element 10 by means of appropriate tools for electrically and mechanically connected to the corresponding terminal (not labeled). The leveling step levels the top surfaces of the solder balls 14 by means of leveling tools 18 when the solder balls 14 are heated to a semi-meltdown status. The soldering step mounts the solder balls 14 onto corresponding electrical contact pads of a mother board 24, and then reheats the solder balls 14 to melting temperature thereby completing the solder process.

Figure 4:
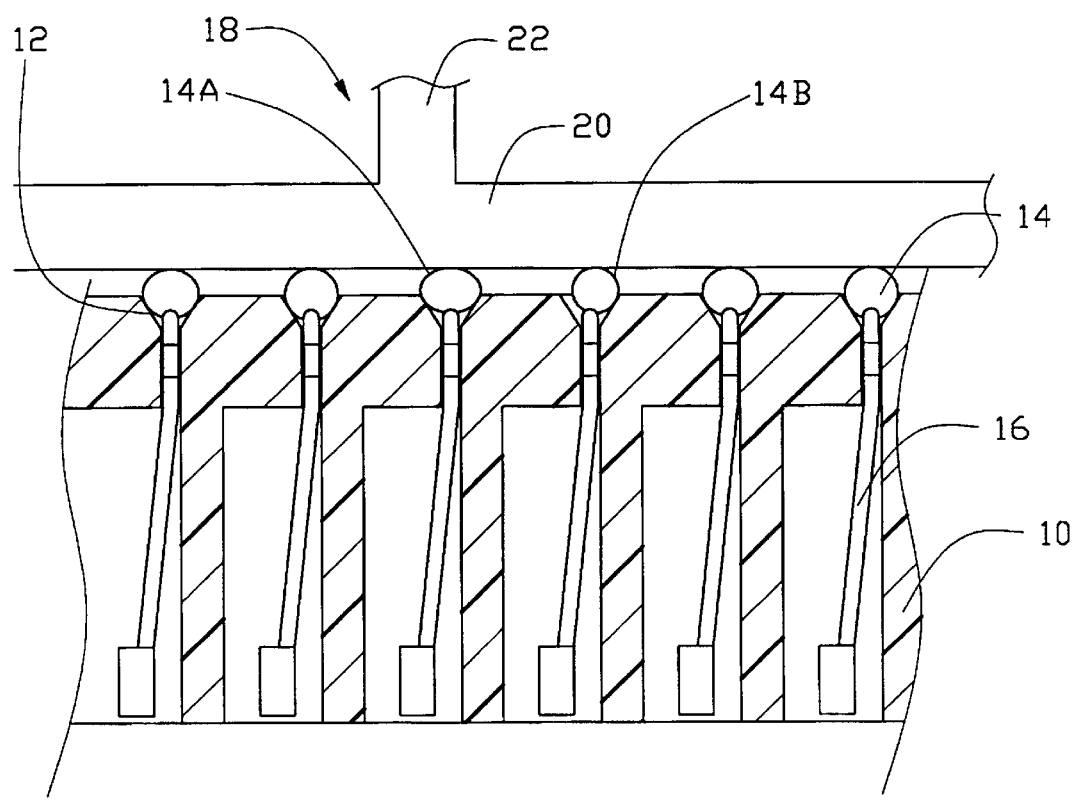
FIG. 4 is a cross-sectional view showing a leveling tool in accordance with the present invention pressing against solder balls.

Referring to FIG. 4, the soldering method in accordance with the present invention is further described in detail as follows. The solder balls 14 are deposited within arcuated chamfers 12 disposed on a soldering surface of the electrical element 10. The solder balls 14 are of different sizes as indicated by solder balls 14A and 14B, thus, top surfaces of the solder balls 14 do not lie in a common plane (as shown in FIG. 3B). If the solder balls 14 are soldered directly onto the motherboard 24 soldering quality will be compromised. The provision of the leveling step which levels the solder balls 14 by means of a leveling tool 18 comprising at least a rod 22 and a leveling board 20, when heated to a semi-meltdown status is realized as follows. The leveling board 20 presses the solder balls 14 against the openings 12 by means of the rod 22 whereby the deformation of the larger solder balls 14A will be greater than the deformation of the smaller solder balls 14B. The top surfaces of all the solder balls 14 will lie in the same plane thereby facilitating soldering to a PCB. Thus, the necessity of reworking open circuits is eliminated, the rate of output of quality products is increased, and, consequently, manufacturing costs are reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for preparing an electrical element suitable for being surface-mounted to a mother board, comprising the steps of:

preparing an electrical element having a plurality of terminal receiving passageways each with a corresponding arcuately chamfered opening;

depositing solder balls at the corresponding arcuately chamfered openings of the terminal receiving passageways of the electrical element; and leveling the solder balls while the solder balls are heated to a predetermined temperature thereby causing top surfaces of the solder balls to lie in a common plane for ensuring proper soldering of the electrical element to a motherboard.

2. The method as claimed in claim 1, wherein the electrical element is an electrical connector.

3. The method as claimed in claim 1, wherein the electrical element is a chip package.

4. The method as claimed in claim 1, wherein the step of leveling is performed by bringing a leveling tool to contact the top surface of each solder ball.

5. The method as claimed in claim 4, wherein the step of leveling is performed by means of the leveling tool pressing the solder balls against the openings.

6. The method as claimed in claim 1, wherein the predetermined temperature is the temperature at which the solder balls are at a semi-meltdown status.

7. A method for electrically connecting an electrical element to a mother board by surface-mount technology, comprising the steps of:

preparing an electrical element having a plurality of terminal receiving passageways each with a corresponding arcuately chamfered opening;

depositing solder balls at the corresponding arcuately chamfered openings of the terminal receiving passageways of the electrical element;

leveling the solder balls while heating the solder balls to a predetermined temperature thereby causing top surfaces of the solder balls to lie in a common plane; and mounting the solder balls onto corresponding contact pads of the motherboard.

8. An electrical element for being mounted to a mother board via a surface mount process, comprising:

a plurality of passageways extending through said element;

an arcuately chamfered opening formed at a top portion of each of said passageways;

a plurality of terminals received within the corresponding passageways, respectively; and a plurality of solder balls deposited in the corresponding arcuately chamfered openings for electrically and mechanically connected to the corresponding terminals, respectively; wherein said solder balls are pressed to have top surfaces thereof at a same plane regardless of whether sizes of said solder balls are the same or not before the electrical element is mounted to a mother board.

* * * * *